United States Patent
Burkley et al.

(10) Patent No.: US 12,253,553 B2
(45) Date of Patent: Mar. 18, 2025

(54) CAVITY ENHANCED COUPLING LASER FOR INCREASED ATOMIC RECEIVER SENSITIVITY

(71) Applicant: BAE Systems Information and Electronic Systems Integration Inc., Nashua, NH (US)

(72) Inventors: Zakary N. Burkley, Amherst, NH (US); Craig C. Price, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 140 days.

(21) Appl. No.: 18/172,418

(22) Filed: Feb. 22, 2023

(65) Prior Publication Data
US 2024/0280622 A1   Aug. 22, 2024

(51) Int. Cl.
*G01R 29/08*   (2006.01)

(52) U.S. Cl.
CPC .............................. *G01R 29/0885* (2013.01)

(58) Field of Classification Search
CPC ............ G01R 29/0885; G01R 29/0892; G01R 29/0878; G01R 33/26; G01R 33/24;
(Continued)

(56) References Cited

U.S. PATENT DOCUMENTS 8,441,644 B2 *   5/2013   Kachanov .............. H01S 5/0064
356/302
9,645,077 B2 *   5/2017   Ognibene .......... G01N 21/3103
(Continued)

FOREIGN PATENT DOCUMENTS

WO   2016205330 A1   12/2016
WO   2022197507 A1   9/2022

OTHER PUBLICATIONS

Shaohua Li, Jinpeng Yuan, Lirong Wang, Liantuan Xiao, Suotang Jia, Enhanced Microwave Electric Field Measurement With Cavity-Assisted Rydberg Electromagnetically Induced Transparency, Frontiers in Physics, https://doi.org/10.3389/fphy.2022.846687, Feb. 24, 2022, vol. 10, Article 846687, Lausanne, Switzerland.
(Continued)

*Primary Examiner* — Vinh P Nguyen
(74) *Attorney, Agent, or Firm* — Sand, Sebolt & Wernow LPA; Gary McFaline

(57) ABSTRACT

A system for enhancing a coupling laser beam to create a larger beam radius thus increasing sensitivity inside the system. The system includes a coupling laser source to emit a coupling laser defining a first power level. The system also includes a resonant optical cavity that is optically aligned with the coupling laser source and the probe laser source. The resonant optical cavity enhances the coupling laser to a second power level that is greater than the first power level inside of the resonant optical cavity. The power increase of the coupling level also increases the sensitivity of the atomic receiver system by increasing the diameter of the coupling laser inside of the resonant optical cavity. The system also includes at least one photodetector positioned outside of and optically aligned with the resonant optical cavity for monitoring a resonance condition of the coupling laser circulating within the resonant optical cavity.

21 Claims, 4 Drawing Sheets

(58) Field of Classification Search
CPC .......................... G01R 33/60; G01R 33/0017; G01R 29/0814; H04B 10/503; H04B 10/70; H04B 2210/006; H04B 10/00; H04B 10/548; H04B 10/61; G02B 2006/12138; G02B 6/32; G02B 6/4204; G02B 6/4298; G02F 1/365; G02F 2202/32

See application file for complete search history.

(56) References Cited

U.S. PATENT DOCUMENTS

| | | | |
|---|---|---|---|
| 10,514,299 B2 * | 12/2019 | Koulikov | ................ G01J 3/433 |
| 11,674,991 B2 * | 6/2023 | Cox | ................... G01R 29/0878 |
| | | | 324/260 |
| 11,766,217 B2 * | 9/2023 | Jiménez-Martínez | ...................... |
| | | | G01R 33/26 |
| | | | 324/244 |

OTHER PUBLICATIONS

Yu-Ting Chen, Michal Szurek, Beili Hu, Julius De Hond, Boris Braverman, Vladan Vuletic, High Finesse Bow-Tie Cavity for Strong Atom-Photon Coupling in Rydberg Arrays, Optics Express, https://arxiv.org/abs/2207.06876, Oct. 10, 2022, vol. 30, Issue 21, Optica Publishing Group, Washington, DC, USA.

Nikunjkumar Prajapati, Narayan Bhusal, Andrew P. Rotunno, Samuel Berweger, Matthew T. Simons, Alexandra B. Artusio-Glimpse, Ying Jue Wang, Eric Bottomley, Haoquan Fan, Christopher L. Holloway, Sensitivity Comparison of Two-Photon vs Three-Photon Rydberg Electrometry, arXiv:2211.11848 [physics.atom-ph], https://doi.org/10.48550/arXiv.2211.11848, Nov. 23, 2022.

* cited by examiner

CAVITY ENHANCED COUPLING LASER FOR INCREASED ATOMIC RECEIVER SENSITIVITY

TECHNICAL FIELD

The present disclosure relates to a system for measuring the electric field amplitude, phase, polarization, and/or frequency of electromagnetic radiation using the response of Rydberg atoms.

BACKGROUND

In the field of radio frequency (or RF), conventional wire antennas are configured to receive electrical transmissions emitted as a radio wave or RF signal. In recent times, however, advances in the field of RF sensor technology, such as systems or devices for sensing with Rydberg atoms, may be configured to utilize Rydberg atoms for desired needs, including low band sensing and communications. In the field of RF sensor technology, atom-based measurements utilizing Rydberg atoms provide benefits in measuring time, field strength, and other physical quantities given these atoms are advantageous in field sensors for measuring microwaves or RF signals. However, maximizing sensitivity of electric field measurements in the RF spectrum when using Rydberg atoms is still an ongoing problem found in the field of RF due to various reasons, including the limitations of commercially-available equipment.

To combat this problem, individuals and companies have developed various atomic systems and architectures to improve sensitivity of measuring desired signals in various ranges of wavelengths. In one example, individuals and companies have developed and designed atomic systems and architectures to specifically improve a probe laser inside of these atomic systems and architectures. While this may be beneficial for certain atomic measurements, these atomic systems and architectures currently lack in various categories. In one instance, these atomic systems and architectures are only applied to a single measurement (such as quantum simulation). In another instance, these atomic systems and architectures lack the capability of continuously increasing optical power inside of the systems. In yet another instance, these atomic systems and architectures focus on the use of trapping atoms inside of designated fields constructed in these atomic systems and architectures.

SUMMARY OF THE INVENTION

In one aspect, an exemplary embodiment of the present disclosure may provide a system. The system may include a coupling laser source to emit a coupling laser beam defining a first power level. The system may also include a probe laser source to emit a probe laser beam. The system may also include a resonant optical cavity optically aligned with the coupling laser source and the probe laser source, wherein the resonant optical cavity receives the coupling laser beam emitted by the coupling laser source and the probe laser beam emitted by the probe laser source; wherein the resonant optical cavity is configured to enhance the coupling laser beam emitted by the coupling laser source to a second power level that is greater than the first power level internal to the resonant optical cavity. The system may also include at least one photodetector positioned external to and optically aligned with the resonant optical cavity configured to monitor a resonance condition of the coupling laser beam circulating within the resonant optical cavity. The system may also include at least another photodetector positioned external to the resonant optical cavity and configured to receive the probe laser beam.

This exemplary embodiment or another exemplary embodiment may further include that the resonant optical cavity comprises: a vapor cell optically positioned between the coupling laser source and the probe laser source; wherein the vapor cell is configured to receive and transmit the coupling laser beam defining the first power level emitted by the coupling laser source; and wherein the vapor cell is configured to receive and transmit the probe laser beam emitted by the probe laser source. This exemplary embodiment or another exemplary embodiment may further include that the vapor cell is an anti-reflection (AR) coated vapor cell or a Brewster cut vapor cell positioned inside of the resonant optical cavity. This exemplary embodiment or another exemplary embodiment may further include that the resonant optical cavity further comprises: at least two reflective mirrors optically aligned with the vapor cell, the coupling laser source, and the probe laser source; and an input coupler optically aligned with the at least two reflective mirrors and the vapor cell; wherein the at least two reflective mirrors and the input coupler are configured to enhance the coupling laser beam emitted by the coupling laser source from the first power level to the second power level. This exemplary embodiment or another exemplary embodiment may further include that the resonant optical cavity further comprises: an input coupler optically aligned with the vapor cell; and a first reflective mirror optically aligned with the vapor cell; wherein the input coupler is configured to receive the coupling laser beam emitted by the coupling laser source and reflect the coupling laser beam towards the vapor cell and the first reflective mirror; and wherein the first reflective mirror is configured to receive the coupling laser beam reflected from the input coupler and through the vapor cell to reflect the coupling laser beam inside of the resonant optical cavity. This exemplary embodiment or another exemplary embodiment may further include that the first reflective mirror comprises: a first optical surface facing the vapor cell; and a second optical surface facing away from the vapor cell and opposite to the first optical surface; wherein each of the first optical surface and the second optical surface are substantially planar. This exemplary embodiment or another exemplary embodiment may further include that the resonant optical cavity further comprises: a second reflective mirror optically aligned with the first reflective mirror; wherein the second reflective mirror is configured to receive the coupling laser beam emitted by the coupling laser source from the first reflective mirror and to reflect the coupling laser beam inside of the resonant optical cavity. This exemplary embodiment or another exemplary embodiment may further include that the second reflective mirror comprises: a first optical surface facing away from the first reflective mirror; and a second optical surface facing towards the first reflective mirror and opposite to the first optical surface; wherein the first optical surface is substantially planar and the second optical surface is concavely-shaped. This exemplary embodiment or another exemplary embodiment may further include that the resonant optical cavity further comprises: a third reflective mirror optically aligned with the second reflective mirror; wherein the third reflective mirror is configured to receive the coupling laser beam reflected from the second reflective mirror and to reflect the coupling laser beam to the input coupler. This exemplary embodiment or another exemplary embodiment may further include that the third reflective mirror comprises: a first optical surface facing the second reflective mirror; and a second optical surface facing away from the second reflective mirror and opposite to the first optical surface; wherein the first optical surface is concavely-shaped and the second optical surface is substantially planar. This exemplary embodiment or another exemplary embodiment may further include that the resonant optical cavity further comprises: a first electric field reflection coefficient defined by the first reflective mirror; a second electric field reflection coefficient defined by the second reflective mirror; a third electric field reflection coefficient defined by the third reflective mirror; and a fourth electric field reflection coefficient defined by the input coupler; wherein the fourth electric field reflection coefficient is less than the first electric field reflection coefficient, second electric field reflection coefficient, and the third electric field reflection coefficient. This exemplary embodiment or another exemplary embodiment may further include a mode matching lens optically aligned with the coupling laser source and the resonant optical cavity; wherein the mode matching lens is configured to receive and transmit the coupling laser beam emitted by the coupling laser source defining the first power level to the resonant optical cavity. This exemplary embodiment or another exemplary embodiment may further include a dichroic mirror optically aligned with the probe laser source and the resonant optical cavity; wherein the dichroic mirror is configured to receive the probe laser beam emitted by the probe laser source from the resonant optical cavity and to reflect the probe laser beam to the at least another photodetector. This exemplary embodiment or another exemplary embodiment may further include that the resonant optical cavity is a bowtie-type resonant optical cavity. This exemplary embodiment or another exemplary embodiment may further include a first beam radius defined by the coupling laser beam emitted by the coupling laser source external of the resonant optical cavity; and a second beam radius defined by the coupling laser beam emitted by the coupling laser source internal of the resonant optical cavity; wherein the second beam radius is greater than the first beam radius for increasing a sensitivity of the resonant optical cavity.

In another aspect, an exemplary embodiment of the present disclosure may provide a resonant optical cavity. The resonant optical cavity may include a vapor cell that is optically aligned between a coupling laser source and a probe laser source. The resonant optical cavity may also include at least two reflective mirrors optically aligned with the vapor cell, the coupling laser source, and the probe laser source. The resonant optical cavity may include an input coupler optically aligned with the vapor cell and the at least two reflective mirrors; wherein the vapor cell, the at least two reflective mirrors, and the input coupler are configured to enhance a coupling laser beam emitted by the coupling laser source from a first power level to a second power level internal of the resonant optical cavity wherein the second power level is greater than the first power level inside of the resonant optical cavity.

This exemplary embodiment or another exemplary embodiment may further include that the at least two reflective mirrors comprise: a first reflective mirror optically aligned with the vapor cell; and a second reflective mirror optically aligned with the first reflective mirror and the input coupler; wherein an optical surface of each of the first reflective mirror and the second reflective mirror is concavely-shaped and face one another. This exemplary embodiment or another exemplary embodiment may further include that the vapor cell is an anti-reflection (AR) coated vapor cell or a Brewster cut vapor cell positioned inside of the resonant optical cavity.

In yet another aspect, an exemplary embodiment of the present disclosure may provide a method of enhancing a coupling laser for an atomic receiver system. The method includes steps of: emitting the coupling laser beam defining a first power level from a coupling laser source of the atomic receiver system to a resonant optical cavity of the atomic receiver system; emitting a probe laser beam from a probe laser source to the resonant optical cavity; continuously reflecting the coupling laser beam emitted by the coupling laser source inside of the resonant optical cavity; monitoring, via the at least one photodetector, a resonance condition of the coupling laser beam emitted by the coupling laser source circulating within the resonant optical cavity; transmitting the probe laser beam emitted by the probe laser source, via the resonant optical cavity, to at least another photodetector of the atomic receiver system; and enhancing the coupling laser beam emitted by the coupling laser source for the atomic receiver system, via the resonant optical cavity, from the first power level to a second power level that is greater than the first power level inside of the resonant optical cavity.

This exemplary embodiment or another exemplary embodiment may further include steps of transmitting the coupling laser defining the first power level from a mode matching lens of the atomic receiver system to an input coupler of the resonant optical cavity; transmitting the coupling laser from the input coupler to a vapor cell of the resonant optical cavity; transmitting the coupling laser from the vapor cell to a first reflective mirror of the resonant optical cavity; transmitting the coupling laser from the first reflective mirror to a second reflective mirror of the resonant optical cavity; transmitting the coupling laser from the second reflective mirror to a third reflective mirror of the resonant optical cavity; and transmitting the coupling laser from the third reflective mirror to the input coupler; wherein the coupling laser defines the second power level; wherein the vapor cell is an anti-reflection (AR) coated vapor cell or a Brewster cut vapor cell positioned inside of the resonant optical cavity. This exemplary embodiment or another exemplary embodiment may further include steps of transmitting the probe laser from the probe laser source to a first reflective mirror of the resonant optical cavity; transmitting the probe laser from the first reflective mirror to a vapor cell of the resonant optical cavity; transmitting the probe laser from the vapor cell to an input coupler of the resonant optical cavity; transmitting the probe laser from the input coupler to a dichroic mirror of the resonant optical cavity; and transmitting the probe laser from the dichroic mirror to the at least another photodetector.

BRIEF DESCRIPTION OF THE DRAWINGS

Sample embodiments of the present disclosure are set forth in the following description, and are shown in the drawings and are particularly and distinctly pointed out and set forth in the appended claims.

Similar numbers refer to similar parts throughout the drawings.

DETAILED DESCRIPTION

Figure 1:
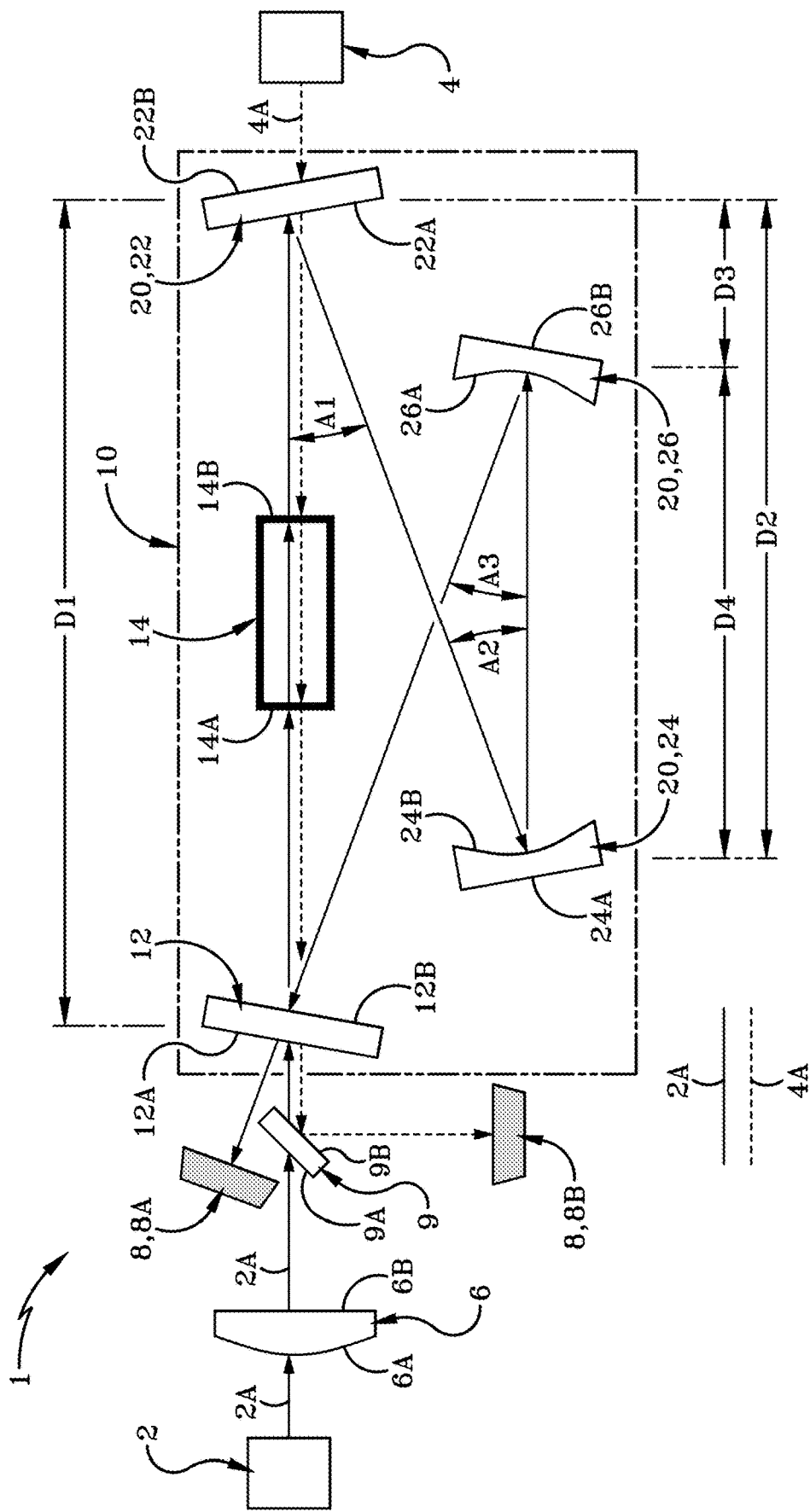
FIG. 1 (FIG. 1) is a diagrammatic view of an atomic receiver system, wherein the system includes a resonant optical cavity for enhancing a power level of a coupling laser beam.

FIG. 1 illustrates a system for atomic receivers, generally referred to as 1, utilized for enhancing and/or increasing the power of a coupling laser for an atomic receiver system. Stated differently, system 1 described and illustrated herein is configured to enhance the power of a coupling laser for increased atomic receiver sensitivity. In one exemplary embodiment described herein, a resonant optical cavity of system 1 may increase and enhance the available coupling laser power by a factor from about 40 times up to about 80 times greater than the current state-of-the-art laser power generated by conventional coupling laser sources while reducing additional wall-power for future platforms. In another exemplary embodiment described herein, an enhancement of a coupling laser inside a resonant optical cavity of system 1 may enable broadening of the interaction area inside the resonant optical cavity of system 1 to effectively capture more signal photons allowing for a ten times increase in radiofrequency-signal gain over conventional atomic receiver systems or systems for sensing with Rydberg atoms, which is the primary metric for quantifying the atomic receiver performance.

It should be appreciated that the term "atomic receiver systems" and equivalent terms used herein simply refers to systems or devices for sensing with Rydberg atoms. As such, the term "atomic receiver systems" and equivalents thereof should not limit or narrow the use of system 1 described and illustrated herein for enhancing and/or increasing the power level of a coupling laser.

System 1 includes a coupling laser source 2. Upon operation of system 1, coupling laser source 2 is configured to emit a coupling laser beam 2A into system 1 for a desired atom-based measurement of time, field-strength, and other physical quantities for atom-based measurements. During operation, coupling laser source 2 emits the coupling laser beam 2A into system 1 defining a first power level and a first wavelength. In one example, the first power level of coupling laser beam 2A emitted by coupling laser source 2 is of about 500 mW in power with a wavelength of about 480 nanometers. It should be appreciated that any suitable, state-of-the-art coupling laser source may be used in system 1 for emitting a coupling laser at a desired wavelength based on the amount of power provided with the coupling laser source.

System 1 also includes a probe laser source 4. Upon operation of system 1, probe laser source 4 is configured to emit a probe laser beam 4A into system 1 for a desired atom-based measurement of time, length, and other physical quantities for atom-based measurements. During operation, probe laser source 4 emits the probe laser beam 4A into system 1 defining a power level and a second wavelength. In one example, the power level of probe laser beam 4A emitted by probe laser source 4 is of about 0.5 mW in power with a wavelength of about 780 nanometers. It should be appreciated that any suitable, state-of-the-art probe laser source may be used in system 1 for emitting a probe laser at a desired wavelength based on the amount of power provided with the probe laser source.

System 1 also includes at least one mode matching lens 6 that optically aligns with the coupling laser source 2. In the illustrated embodiment, a single mode matching lens 6 is provided that optically aligns with the coupling laser source 2. Mode matching lens 6 may be configured to receive and direct the coupling laser beam 2A with a first power level from the coupling laser source 2 to a resonant optical cavity of system 1, which is described in more detail below. Mode matching lens 6 may include a first optical surface 6A and a second optical surface 6B opposite to the first optical surface 6A where the first optical surface 6A and the second optical surface 6B face in opposite directions. In one example, first optical surface 6A of mode matching lens 6 may be a convex-shaped surface, and the second optical surface 6B of mode matching lens 6 may be a substantially planar surface. In other exemplary embodiments, first optical surface 6A of mode matching lens 6 and second optical surface 6B of mode matching lens 6 may be configured to define any suitable shape based on the desired intent of mode matching lens 6.

System 1 also includes at least one photodetector 8 for receiving and monitoring at least one of the coupling laser beam 2A emitted by coupling laser source 2 and the probe laser beam 4A emitted by probe laser source 4. As best seen in FIG. 1, system 1 includes a first coupling photodetector 8A that may be optically aligned with the coupling laser beam 2A. The coupling photodetector 8A is also positioned outside of a resonant optical cavity of system 1, which is described in further detail below. The coupling photodetector 8A is configured to receive and monitor the coupling laser beam 2A as the coupling laser beam 2A circulates or is reflected inside of a resonant optical cavity of system 1. More particularly, coupling photodetector 8A is optically aligned with a resonant optical cavity of system 1 for receiving and monitoring the coupling laser beam 2A at the first power level as the coupling laser beam 2A circulates inside of a resonant optical cavity of system 1 in which the coupling laser beam 2A is further enhanced to the second power level. In one example, the coupling photodetector 8A is a photodiode device.

During operation, coupling photodetector 8A is configured to monitor a resonance condition of a resonant optical cavity of system 1 and to maintain the resonance of a resonant optical cavity via a conventional laser or cavity stabilization techniques. It should be appreciated that any suitable laser or cavity stabilization technique may be used for monitoring and maintaining resonance condition of resonant optical cavity of system 1. As used herein, a resonance condition refers to matching the frequency of light to a resonator mode of the optical cavity 10 of system 1 emitted by a laser device (e.g., coupling laser source 2), which can be done by adjusting the frequency of the coupling laser source 2 or length of the optical cavity 10. In one example, the Pound-Drever-Hall locking technique may be used in system 1 for coupling photodetector 8A for monitoring and maintaining resonance condition of resonant optical cavity of system 1.

Still referring to FIG. 1, system 1 also includes a second or probe photodetector 8B that is optically aligned with probe laser source 4 for receiving and measuring the probe laser beam 4A. The probe photodetector 8B is also positioned outside of a resonant optical cavity of system 1, which is described in greater detail below. The probe photodetector 8B is also configured to receive and measure the probe laser beam 4A emitted by probe laser source 4. In one example, the probe photodetector 8B is a photodiode device.

System 1 also includes a dichroic mirror 9. As best seen in FIG. 1, dichroic mirror 9 is optically aligned with the probe laser source 4 and probe photodetector 8B. With such alignment, dichroic mirror 9 is configured to receive and direct the probe laser 4B towards the probe photodetector 8B during operation of system 1. Dichroic mirror 9 may include a first optical surface 9A and a second optical surface 9B opposite to the first optical surface 9A where the first optical surface 9A and the second optical surface 9B face in opposite directions. In one example, first optical surface 9A of dichroic mirror 9 and the second optical surface 9B of dichroic mirror 9 may be substantially planar surfaces. In other exemplary embodiments, first optical surface 9A of dichroic mirror 9 and second optical surface 9B of dichroic mirror 9 may be configured to define any suitable shape based on the desired intent of dichroic mirror 9. Still referring to FIG. 1, dichroic mirror 9 is also optically aligned with the coupling laser source 2. With such alignment, dichroic mirror 9 is also configured to receive and transmit the coupling laser beam 2A defining a first power level towards a resonant optical cavity of the system 1 during operation of system 1.

System 1 also include a resonant optical cavity 10 that is optically aligned with the coupling laser source 2 and the probe laser source 4. Resonant optical cavity 10 is also optically aligned with the mode matching lens 6, the coupling photodetector 8A, the probe photodetector 8B, and the dichroic mirror 9. As described in more detail, resonant optical cavity 10 includes components and elements for increasing and enhancing the coupling laser beam 2A from a first power level to a second power level inside or internal of the resonant optical cavity 10 without increasing the wall power requirements of the coupling laser source 2. In one example, components and elements of resonant optical cavity 10 define a bowtie-shaped configuration for increasing and enhancing the coupling laser beam 2A from a first power level to a second power level without increasing the wall power requirements of the coupling laser source 2. Such components and elements that form the resonant optical cavity 10 of system 1 are described in greater detail below.

For clarity, a dashed box is shown in FIG. 1 denoting the resonant optical cavity 10 discussed herein. As such, components and elements internal of the dashed box labeled 10 form the resonant optical cavity 10 for increasing and enhancing the coupling laser beam 2A from a first power level to a second power level occur inside or internal of the resonant optical cavity 10 without increasing the wall power requirements of the coupling laser source 2.

Resonant optical cavity 10 includes an input coupler 12 that is optically aligned with the coupling laser source 2 and the probe laser source 4. Input coupler 12 may include a first optical surface 12A and a second optical surface 12B opposite to the first optical surface 12A where the first optical surface 12A and the second optical surface 12B face in opposite directions. In one example, first optical surface 12A of input coupler 12 and the second optical surface 12B of input coupler 12 may be substantially planar surfaces. In other exemplary embodiments, first optical surface 12A of input coupler 12 and second optical surface 12B of input coupler 12 may be configured to define any suitable shape based on the desired intent of input coupler 12. Input coupler 12 is also positioned optically behind the mode matching lens 6 such that the mode matching lens 6 directs the coupling laser beam 2A to the input coupler 12. As such, the first optical surface 12A of input coupler 12 faces in the direction of the mode matching lens 6, particularly the second optical surface 6B of mode matching lens 6.

It should be appreciated that input coupler 12 may also be configured with any suitable transmission characteristics and reflectivity characteristics dictated by the implementation of resonant optical cavity 10 in system 1. In one example, input coupler 12 may be configured with a desired transmission characteristic and reflectivity characteristic where input coupler 12 receives the coupling laser beam 2A defining the first power level from the mode matching lens 6 and transmits the coupling laser beam 2A through a vapor cell 14 of resonant optical cavity 10 for increasing RF sensitivity inside of the vapor cell 14 and to a set of high reflectivity mirrors of the resonant optical cavity 10 for power enhancement, which is described in more detail below (see FIG. 1). Continuing with this example, input coupler 12 may also be configured with a desired transmission characteristic and reflectivity characteristic where input coupler 12 receives the coupling laser beam 2A defining the second power level enhanced by at least two reflective mirrors of the resonant optical cavity 10 and input coupler 12 and transmitted to coupling photodetector 8A for monitoring the at least two reflective mirrors of resonant optical cavity 10 are also described in greater detail below. Continuing with this example, input coupler 12 may also be configured with a desired transmission characteristic and reflectivity characteristic where input coupler 12 receives and transmits the probe laser beam 4A towards the dichroic mirror 9.

Figure 2:
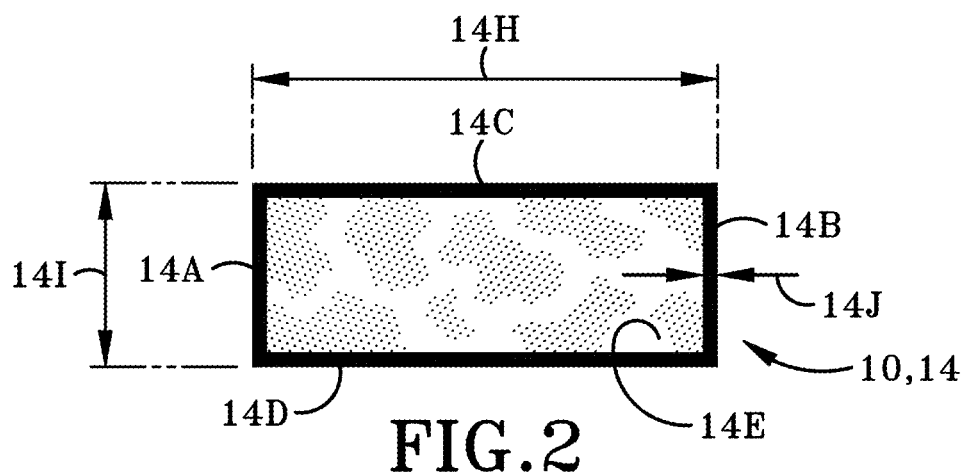
FIG. 2 (FIG. 2) is a diagrammatic view of a vapor cell of the system shown in FIG. 1.

Resonant optical cavity 10 may also include at least one vapor cell 14 that is optically aligned with mode matching lens 6 and input coupler 12. As best seen in FIG. 1, resonant optical cavity 10 includes a single vapor cell 14 that is optically aligned with at least two reflective mirrors 22, 24 of the resonant optical cavity 10 and input coupler 12 and positioned between the coupling laser source 2 and the probe laser source 4. As best seen in FIGS. 1 and 2, vapor cell 14 may include a first wall 14A, a second wall 14B longitudinally opposite to the first wall 14A, and a longitudinal direction defined therebetween. Referring only to FIG. 2, vapor cell 14 may include a third wall 14C that extends longitudinally between the first wall 14A and the second wall 14B, a fourth wall 14D that extends longitudinally between the first wall 14A and the second wall 14B and is opposite to the third wall 14C, and a transverse direction defined therebetween. It should be appreciated that vapor cell 14 may be any suitable container of atoms or ions that may create Rydberg atoms during operation of system 1.

Still referring to FIG. 2, first wall 14A, second wall 14B, third wall 14C and fourth wall 14D collectively define an exterior surrounding surface 14E that extends along the entire length of vapor cell 14. Still referring to FIG. 2, first wall 14A, second wall 14B, third wall 14C and fourth wall 14D collectively define an interior surrounding wall 14F that extends along the entire length of vapor cell 14 and faces in a direction opposite to the exterior surrounding surface 14E. First wall 14A, second wall 14B, third wall 14C and fourth wall 14D also collectively define a chamber 14G configured to house various atoms or molecules necessary for interacting with one or both of the coupling laser beam 2A at the second power level and the probe laser beam 4A.

Still referring to FIG. 2, vapor cell 14 may also define a length 14H that is measured between the first wall 14A and the second wall 14B. Vapor cell 14 may also define a radius or width 141 that is measured between the third wall 14C and the fourth wall 14D. Vapor cell 14 may also define a thickness 14J that is measured between the exterior surrounding surface 14E and the interior surrounding wall 14F. In one example, vapor cell 14 may define a length 14H of about 50 millimeters, a width 14I of about 25 millimeters, and a thickness 14J less than the length 14H and the width 14I. It should be appreciated that vapor cell 14 described and illustrated herein may define any suitable length, width, and thickness dictated by the implementation of vapor cell 14 in the resonant optical cavity 10 of system 1, including the size of a probe beam used in a system, optimum path length for the probe beam, and other various considerations.

As discussed previously, vapor cell 14 is optically aligned with the mode matching lens 6 and the input coupler 12 such that the vapor cell 14 receives the coupling laser beam 2A defining a second power level from the input coupler 12 for increasing the RF sensitivity of the vapor cell 14. As best seen in FIG. 1, the coupling laser beam 2A defining a second power level is directed from the input coupler 12 at the second optical surface to the first wall 14A of the vapor cell 14. Once received, the coupling laser beam 2A defining the second power level passes through the chamber 14G of vapor cell 14 and interacts with the atoms or molecules disposed inside of the vapor cell 14 for atomic measurements. Vapor cell 14 is then configured to transmit the coupling laser beam 2A defining the second power level to at least one reflective mirror of at least two reflective mirrors of resonant optical cavity 10, which are described in greater detail below. It should be understood that the vapor cell 14 is free from increasing and/or enhancing the coupling laser beam 2A from the first power level to the second power level inside of or internal of the resonant optical cavity 10.

Vapor cell 14 is also configured to enable the probe laser beam 4A emitted by probe laser source 4 to pass through the vapor cell 14 from the second wall 14B to the first wall 14A during operation. Once received, the probe laser beam 4A passes through the chamber 14G of vapor cell 14 and interacts with the atoms or molecules disposed inside of the vapor cell 14 for atomic measurements. Vapor cell 14 is then configured to transmit the probe laser beam 4A to the input coupler 12 in which the probe laser beam 4A is received by probe photodetector 8B.

In one example, vapor cell 14 may be an anti-reflection (AR) coated vapor cell including Rydberg atoms positioned inside of the vapor cell 14. Such inclusion of the vapor cell 14 being an AR coated vapor cell including Rydberg atoms inside of vapor cell 14 minimizes transmission losses of the coupling laser 2B. In this example, vapor cell 14 being an AR coated vapor cell including Rydberg atoms enables a transmission loss of about less than one percent when a coupling laser has a wavelength of about 480 nanometers. Continuing with this example, vapor cell 14 being an AR coated vapor cell including Rydberg atoms may also be used for minimizing transmission losses of the probe laser 4B. In another example, vapor cell 14 may be a Brewster cut vapor cell where the vapor cell 14 includes a Brewster cut at the wavelength of the coupling laser beam 2A. Similar to the previous example, the Brewster cut vapor cell is also positioned inside of the resonant optical cavity.

Resonant optical cavity 10 may also include a set of reflective mirrors 20 where each mirror of the set of reflective mirrors 20 is configured with a greater reflectivity than input coupler 12. The set of reflective mirrors 20 is configured to enhance and/or increase the power level of the coupling laser beam 2A from the first power level initially emitted and generated by coupling laser source 2 to the second power level that is greater than the first power level initially emitted and generated by coupling laser source 2. The mirrors of the set of reflective mirrors 20 are described in greater detail below. Furthermore, while the set of reflective mirrors 20 are referred to as "mirrors" it is to be understood that the mirrors in the set of reflective mirrors 20 may be any structural device that performs the set of functions herein to assist in the enhancement of the laser beams. For example, rather than a mirror, the set of mirrors 20 could include any rigid or flexible member that effects the laser beam or other light source in any way.

It should be appreciated the set of reflective mirrors 20 described and illustrated herein are high reflectivity (HR) mirrors 20 for enhancing and/or increasing the power level of the coupling laser beam 2A from the first power level initially emitted and generated by coupling laser source 2 to the second power level that is greater than the first power level inside of or internal of the resonant optical cavity 10. In one example, the high reflectivity mirrors 20 may have a reflectivity greater than 99% for enhancing and/or increasing the power level of the coupling laser beam 2A from the first power level initially emitted and generated by coupling laser source 2 to the second power level that is greater than the first power level. In yet another example, the high reflectivity mirrors 20 may have a reflectivity ranging from about 99.8% up to about 99.999%, for enhancing and/or increasing the power level of the coupling laser beam 2A from the first power level initially emitted and generated by coupling laser source 2 to the second power level that is greater than the first power level The set of reflective mirrors 20 includes a first reflective mirror 22 optically aligned with the vapor cell 14. First reflective mirror 22 may include a first optical surface 22A and a second optical surface 22B opposite to the first optical surface 22A where the first optical surface 22A and the second optical surface 22B face in opposite directions. In one example, first optical surface 22A of first reflective mirror 22 and the second optical surface 22B of first reflective mirror 22 may be substantially planar surfaces. In other exemplary embodiments, first optical surface 22A of first reflective mirror 22 and second optical surface 22B of first reflective mirror 22 may be configured to define any suitable shape based on the desired intent of first reflective mirror 22.

As best seen in FIG. 1, first reflective mirror 22 is also positioned optically behind the vapor cell 14 such that first reflective mirror 22 receives the coupling laser beam 2A from the vapor cell 14. In the illustrated embodiment, vapor cell 14 directs the coupling laser beam 2A defining the second power level to the first optical surface 22A of first reflective mirror 22. As such, the first optical surface 22A of first reflective mirror 22 faces in the direction of the vapor cell 14, particularly the second wall 14B of vapor cell 14. It should be appreciated that while first reflective mirror 22 is also optically positioned behind the vapor cell 14, first reflective mirror 22 may be optically positioned at any suitable location and orientation relative to the vapor cell 14 for enhancing the coupling laser beam 2A from the first power level to the second power level inside of or internally of the resonant optical cavity 10.

The set of reflective mirrors 20 also includes a second reflective mirror 24 optically aligned with the first reflective mirror 22. Second reflective mirror 24 may include a first optical surface 24A and a second optical surface 24B opposite to the first optical surface 24A where the first optical surface 24A and the second optical surface 24B face in opposite directions. In one example, first optical surface 24A of second reflective mirror 24 is substantially planar or flat, and the second optical surface 24B of second reflective mirror 24 is curved or concavely-shaped. In other exemplary embodiments, first optical surface 24A of second reflective mirror 24 and second optical surface 24B of second reflective mirror 24 may be configured to define any suitable shape based on the desired intent of second reflective mirror 24, including both first optical surface 24A and second optical surface 24B both being substantially planar or flat, being curved or concavely-shaped, and other suitable shapes.

As best seen in FIG. 1, second reflective mirror 24 is also positioned optically below the first reflective mirror 22 such that the first reflective mirror 22 directs the coupling laser beam 2A to the second reflective mirror 24 after being received by first reflective mirror 22. In the illustrated embodiment, first reflective mirror 22 reflects the coupling laser beam 2A to the second optical surface 24B of second reflective mirror 24. As such, the second optical surface 24B of second reflective mirror 24 faces in the direction of the first reflective mirror 22, particularly the second optical surface 24B of second reflective mirror 24. It should be appreciated that while second reflective mirror 24 is also positioned optically behind the first reflective mirror 22, second reflective mirror 24 may be optically positioned at any suitable location and orientation relative to the first reflective mirror 22 for enhancing the coupling laser beam 2A from the first power level to the second power level inside of or internally of the resonant optical cavity 10.

The set of reflective mirrors 20 also includes a third reflective mirror 26 optically aligned with the second reflective mirror 24 as well as the input coupler 12 and the coupling photodetector 8A. Third reflective mirror 26 may include a first optical surface 26A and a second optical surface 26B opposite to the first optical surface 26A where the first optical surface 26A and the second optical surface 26B face in opposite directions. In one example, first optical surface 26A of third reflective mirror 26 is curved or concavely-shaped, and the second optical surface 26B of third reflective mirror 26 is substantially planar or flat. In other exemplary embodiments, first optical surface 26A of third reflective mirror 26 and second optical surface 26B of third reflective mirror 26 may be configured to define any suitable shape based on the desired intent of third reflective mirror 26, including both first optical surface 26A and second optical surface 26B both being substantially planar or flat, being curved or concavely-shaped, and other suitable shapes.

Third reflective mirror 26 is also positioned optically behind the second reflective mirror 24 such that the second reflective mirror 24 directs the coupling laser beam 2A to the third reflective mirror 26 after being received by second reflective mirror 24. In the illustrated embodiment, second reflective mirror 24 reflects the coupling laser beam 2A to the first optical surface 26A of third reflective mirror 26. As such, the first optical surface 26A of third reflective mirror 26 faces in the direction of the second reflective mirror 24, particularly the first optical surface 26A of third reflective mirror 26. It should be appreciated that while third reflective mirror 26 is also positioned optically behind the second reflective mirror 24, third reflective mirror 26 may be optically positioned at any suitable location and orientation relative to the second reflective mirror 24 for enhancing the coupling laser beam 2A from the first power level to the second power level inside of or internally of the resonant optical cavity 10.

It should be appreciated that first reflective mirror 22 may be configured with any suitable transmission characteristics and reflectivity characteristics dictated by the implementation of resonant optical cavity 10 in system 1. In one example, first reflective mirror 22 may be configured with a desired transmission characteristic and reflectivity characteristic where first reflective mirror 22 receives the coupling laser beam 2A defining the second power level from the vapor cell 14 and reflects the coupling laser beam 2A to the second reflective mirror 24 for power enhancement of coupling laser beam 2A to the second power level inside of the resonant optical cavity 10. Continuing with this example, first reflective mirror 22 may also be configured with a desired transmission characteristic and reflectivity characteristic where first reflective mirror 22 receives and transmits the probe laser beam 4A emitted by probe laser source 4 towards the input coupler 12.

It should also be appreciated that second reflective mirror 24 may be configured with any suitable transmission characteristics and reflectivity characteristics dictated by the implementation of resonant optical cavity 10 in system 1. In one example, second reflective mirror 24 may be configured with a desired transmission characteristic and reflectivity characteristic where second reflective mirror 24 receives the coupling laser beam 2A from the first reflective mirror 22 and reflects the coupling laser beam 2A to the third reflective mirror 26 for power enhancement of coupling laser beam 2A to the second power level inside of the resonant optical cavity 10.

It should also be appreciated that third reflective mirror 26 may be configured with any suitable transmission characteristics and reflectivity characteristics dictated by the implementation of resonant optical cavity 10 in system 1. In one example, third reflective mirror 26 may be configured with a desired transmission characteristic and reflectivity characteristic where third reflective mirror 26 receives the coupling laser beam 2A from the second reflective mirror 24 and reflects the coupling laser beam 2A back to the input coupler 12 for enabling continued enhancement of the coupling laser beam 2A at the second power level inside of or internally of the resonant optical cavity 10.

The input coupler 12 and each mirror of the set of reflective mirrors 20 may also define an electric field reflection coefficient for enhancing and increasing the coupling laser beam 2A from the first power level to the second power level. As such, first reflective mirror 22 may define a first electric field reflection coefficient, second reflective mirror 24 may define a second electric field reflection coefficient, third reflective mirror 26 may define a third electric field reflection coefficient, and input coupler may define a fourth electric field reflection coefficient. In one example, first electric field reflection coefficient of first reflective mirror 22, second electric field reflection coefficient of second reflective mirror 24, third electric field reflection coefficient of third reflective mirror 26, and fourth electric field reflection coefficient of input coupler 12 are equal with one another. In another example, first electric field reflection coefficient of first reflective mirror 22, second electric field reflection coefficient of second reflective mirror 24, third electric field reflection coefficient of third reflective mirror 26, and fourth electric field reflection coefficient of input coupler 12 are different from one another. In yet another example, three electric field reflection coefficients of the first electric field reflection coefficient of first reflective mirror 22, second electric field reflection coefficient of second reflective mirror 24, third electric field reflection coefficient of third reflective mirror 26, and fourth electric field reflection coefficient of input coupler 12 are equal with one another with the remaining electric field reflection coefficient being different In this previous example, the fourth electric field reflection coefficient of input coupler 12 is less than the first electric field reflection coefficient of first reflective mirror 22, second electric field reflection coefficient of second reflective mirror 24, and third electric field reflection coefficient of third reflective mirror 26.

It should also be appreciated that input coupler 12 and each mirror of the set of reflective mirrors 20 may be oriented at any suitable angle relative to the vapor cell 14 or other components provided in resonant optical cavity 10 or system 1.

With respect to input coupler 12, input coupler 12 may be oriented at a first angle relative to mode matching lens 6 and vapor cell 14. As best seen in FIG. 1, input coupler 12 may be oriented towards the third reflective mirror 26. More particularly, second optical surface 12B of input coupler 12 may be oriented towards the third reflective mirror 26, and the first optical surface 12A of input coupler 12 may be oriented towards the coupling photodetector 8B. Such orientation of input coupler 12 enables transmission of the coupling laser beam 2A at the second power level to the vapor cell 14.

With respect to first reflective mirror 22, first reflective mirror 22 may be oriented at a second angle relative to vapor cell 14 where the second angle of first reflective mirror 22 may be a congruent angle with first angle of input coupler 12. As best seen in FIG. 1, first reflective mirror 22 may be oriented towards the second reflective mirror 24. More particularly, first optical surface 22A of first reflective mirror 22 may be oriented towards the second reflective mirror 24. Such orientation of first reflective mirror 22 enables reflection of the coupling laser beam 2A to the second reflective mirror 24 for enhancing the coupling laser beam 2A from the first power level to the second power level.

With respect to second reflective mirror 24, second reflective mirror 24 may be oriented at a third angle relative to vapor cell 14 where the third angle of second reflective mirror 24 may be a congruent angle with second angle of first reflective mirror 22. As best seen in FIG. 1, second reflective mirror 24 may be oriented towards the first reflective mirror 22. More particularly, second optical surface 24B of second reflective mirror 24 may be oriented towards the first reflective mirror 22. Such orientation of second reflective mirror 24 enables the second reflective mirror 24 to receive the coupling laser beam 2A from the first reflective mirror 22 while also reflecting the coupling laser beam 2A to the third reflective mirror 26 for enhancing the coupling laser beam 2A from the first power level to the second power level.

With respect to third reflective mirror 26, third reflective mirror 26 may be oriented at a fourth angle relative to vapor cell 14 where the fourth angle of third reflective mirror 26 may be a congruent angle with third angle of second reflective mirror 24. As best seen in FIG. 1, third reflective mirror 26 may be oriented towards the input coupler 12. More particularly, first optical surface 26A of third reflective mirror 26 may be oriented towards the second optical surface 12B of input coupler 12. Such orientation of third reflective mirror 26 enables the third reflective mirror 26 to receive the coupling laser beam 2A from the second reflective mirror 24 while also reflecting the coupling laser beam 2A to the input coupler 12 and the coupling photodetector 8A where the coupling laser beam 2A defines the second power level.

It should also be appreciated that coupling laser beam 2A may be reflected at desired angles between at least two reflective mirrors of the set of reflective mirrors 20. In one instance, coupling laser beam 2A may be reflected at a first angle A1 from the first reflective mirror 22 to the second reflective mirror 24 based on the orientation and/or structural configuration of the first reflective mirror 22. Continuing with this example, coupling laser beam 2A may also be reflected at a second angle A2 from the second reflective mirror 24 to the third reflective mirror 26 based on the orientation and/or structural configuration of the second reflective mirror 24. Still continuing with this example, coupling laser beam 2A may also be reflected at a third angle A3 from the third reflective mirror 26 to the input coupler 12 and coupling photodetector 8A based on the orientation and/or structural configuration of the third reflective mirror 26. Such angles A1, A2, A3 described and illustrated herein may be any suitable angles determined through an ABCD matrix calculation to set the desired beam radius in each dimension and to minimize astigmatism.

It should also be appreciated that input coupler 12 and each mirror of the set of reflective mirrors 20 may be positioned at desired distance relative to one another inside system 1. As best seen in FIG. 1, a first distance D1 may be measured between input coupler 12 and the first reflective mirror 22, a second distance D2 may be measured between the first reflective mirror 22 and the second reflective mirror 24, a third distance D3 may be measured between the first reflective mirror 22 and the third reflective mirror 26, and a fourth distance D4 may be measured between the second reflective mirror 24 and the third reflective mirror 26. In one example, first distance D1 is greater than the second distance D2, the third distance D3, and the fourth distance D4. Continuing with this example, second distance D2 is greater than the third distance D3 and the fourth distance D4. Still continuing with this example, fourth distance D4 is greater than the third distance.

The structural configuration of system 1 including the resonant optical cavity 10 is considered advantageous at least because the input coupler 12, the first reflective mirror 22, the second reflective mirror 24, and the third reflective mirror 26 collectively enhance or increase the power level of the coupling laser beam 2A, emitted by the coupling laser source 2, from the first power level to the second power level inside of the resonant optical cavity 10. As the coupling laser beam 2A enters into the resonant optical cavity 10, the coupling laser beam 2A incrementally increases from the first power level to the second power level as the coupling laser beam 2A reflects off because the input coupler 12, the first reflective mirror 22, the second reflective mirror 24, and the third reflective mirror 26. As such, the coupling laser beam 2A incrementally increases from the first power level to the second power level as the coupling laser beam 2A reflects off the input coupler 12, the first reflective mirror 22, the second reflective mirror 24, and the third reflective mirror 26 for an exemplary number of round trips or cycles inside of the resonant optical cavity 10. In one example, the coupling laser beam 2A may incrementally increase from the first power level to the second power level as the coupling laser beam 2A reflects off the input coupler 12, the first reflective mirror 22, the second reflective mirror 24, and the third reflective mirror 26 between about sixty round trips or cycles inside of the resonant optical cavity 10 up to one hundred round trips or cycles inside of the resonant optical cavity 10. Such number of round trips or cycles in order to incremental increase of the coupling laser beam 2A from the first power level to the second power level is dependent on the reflectivity of the input coupler 12, the first reflective mirror 22, the second reflective mirror 24, and the third reflective mirror 26. As illustrated in FIG. 1, the coupling laser beam 2A is enhanced to the second power level via the reflective properties provided by the input coupler 12, the first reflective mirror 22, the second reflective mirror 24, and the third reflective mirror 26.

Figure 4A:
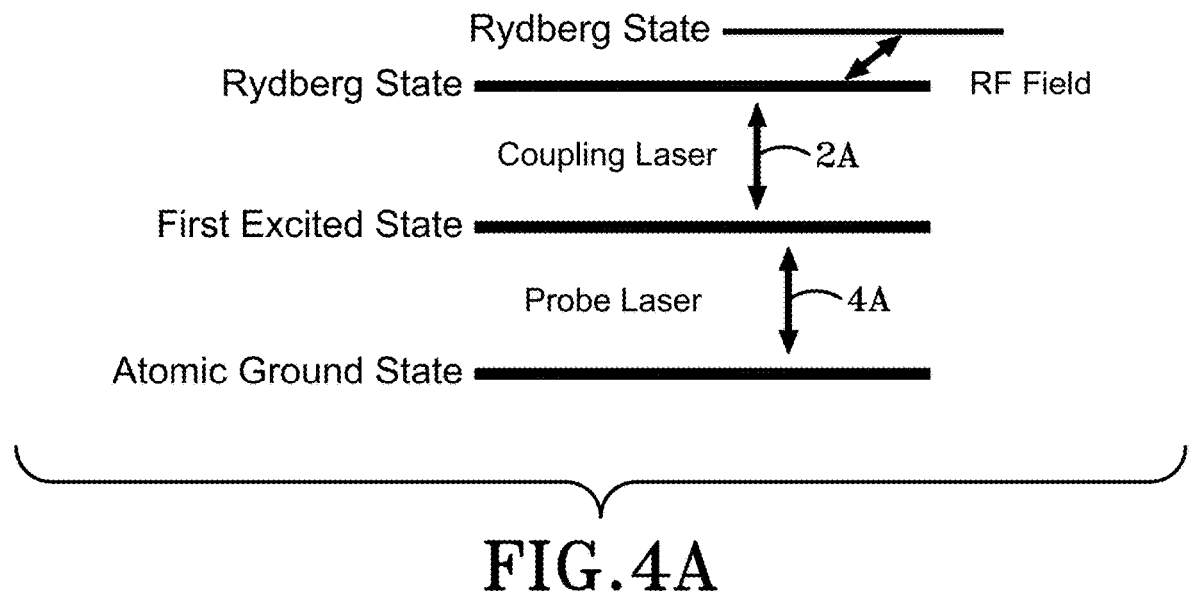
FIG. 4A (FIG. 4A) is an exemplary chart showing energy levels of the probe laser beam and the coupling laser beam emitted in the system shown in FIG. 1.

The structural configuration of system 1 including the resonant optical cavity 10 is also considered advantageous at least because the combination of the coupling photodetector 8A and the resonant optical cavity 10 enables atoms provided inside of the vapor cell 14 (e.g., Rydberg atoms) to be excited from a first energy or excited state to a second energy or excited state that is greater than the first excited state in order to provide greater sensitivity when sensing RF signals across the RF spectrum. As best seen in FIG. 4A, the probe laser beam 4A emitted by probe laser 4 initially increases the excitement state of the atoms provided in the vapor cell 14 from the atomic ground state to a first excited state. Once in the first excited state, resonant optical cavity 10 then further increases the excitement state of the atom provided in vapor cell 14 from the first excited state to the Rydberg excited state via the enhancement of coupling laser beam 2A. As such, the combination of the coupling photodetector 8A and the resonant optical cavity 10 enables atoms provided in the vapor cell 14 to be excited to a Rydberg excited state in order to provide greater sensitivity when sensing RF signals across the RF spectrum or field.

The structural configuration of system 1 including the resonant optical cavity 10 is also considered advantageous at least because the overall size of the coupling laser beam 2A increases once enhanced by the resonant optical cavity 10 without decreasing the intensity of the coupling laser beam 2A emitted from the coupling laser source 2. In one instance, coupling laser beam 2A may define a first diameter once emitted from the coupling laser source 2 exterior to the resonant optical cavity 10. In this same instance, the coupling laser beam 2A may then define a second diameter that is greater than the first diameter initially emitted from the coupling laser source 2 due to input coupler 12 and the set of the reflective mirrors 20 continuously reflecting the coupling laser beam 2A inside of the resonant optical cavity 10. By increasing the size of coupling laser beam 2A, the sensitivity of the system 1 increases when sensing RF signals across the RF spectrum or field. In one exemplary embodiment, the diameter of coupling laser beam 2A may be between about one millimeter up to three millimeters (or radius from about 0.5 millimeter up to 1.5 millimeters).

Figure 4B:
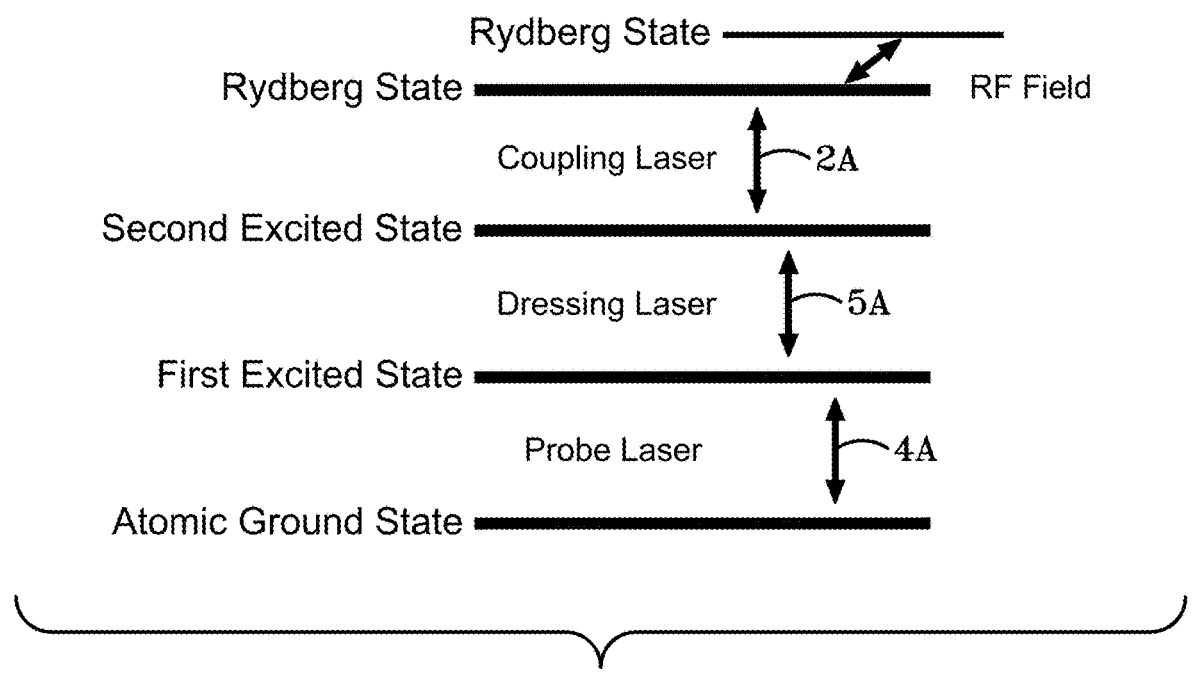
FIG. 4B (FIG. 4B) is another exemplary chart similar to FIG. 4A, but the chart shows energy levels of a probe laser beam, a dressing laser beam, and a coupling laser beam in a three-laser system configuration.

While system 1 include two laser sources (i.e., coupling laser source 2A and probe laser source 4A), any suitable numbers laser sources may be included in a system for increase the sensitivity of the system when sensing RF signals across the RF spectrum or field. In one example, and as seen in FIG. 4B, a system may include a three-photon design or three laser sources for increasing the sensitivity of the system when sensing RF signals across the RF spectrum or field. In this example, the system may include the coupling laser source 2 that emits the coupling laser beam 2A, the probe laser source 4 that emits the probe laser beam 4A, and a dressing laser source that emits a dressing laser 5A. As seen in FIG. 4B, the probe laser beam 4A emitted by probe laser 4 initially increases the excitement state of the atoms provided in the vapor cell 14 from the atomic ground state to a first excited state via. Once in the first excited state, a dressing laser source that emits the dressing laser 5A further increases the excitement state of the atom provided in vapor cell 14 from the first excited state to the to a second excited or energy state. Once in the second excited state, resonant optical cavity 10 then further increases the excitement state of the atom provided in vapor cell 14 from the second excited state to a third or Rydberg excited or energy state via the enhancement of coupling laser beam 2A. As such, the combination of three laser sources, the coupling photodetector 8A, and the resonant optical cavity 10 enables atoms provided in the vapor cell 14 to be excited to the Rydberg excited state in order to provide greater sensitivity when sensing RF signals across the RF spectrum or field. Such use of three laser sources in this exemplary embodiment may provide greater sensitivity when sensing RF signals across the RF spectrum.

Having now described the components and elements of system 1 having a resonant optical cavity 10, a method of using system 1 with resonant optical cavity 10 is described in more detail below.

Initially, the coupling laser source 2 is initiated from an OFF state to an ON state to generate and emit the coupling laser beam 2A. As stated previously, the coupling laser beam 2A emitted from the coupling laser source 2 is emitted at a first power level based on the wall power or coupling power of the coupling laser source 2. In one example, the coupling laser source 2 may be limited to a power of about 0.5 W thus emitting the coupling laser beam 2A defining the first power level. Simultaneously, the probe laser source 4 is also initiated from an OFF state to an ON state to generate and emit the probe laser beam 4A. Once initiated, the coupling laser beam 2A and the probe laser beam 4A are emitted to the resonant optical cavity 10 in which the coupling laser beam 2A is enhanced and increased from the first power level to the second power level in at least one round trip inside of resonant optical cavity 10.

With respect to the coupling laser beam 2A, the coupling laser beam 2A may initially interact with the mode matching lens 6 upon being emitted from coupling laser source 2. More particularly, the coupling laser beam 2A may initially interact with the first optical surface 6A of mode matching lens 6 upon being emitted from coupling laser source 2. At this stage, the coupling laser beam 2A remains at the first power level once the coupling laser beam 2A interacts with and passes through the mode matching lens 6. The mode matching lens 6 may then direct the coupling laser beam 2A defined at the first power level towards the resonant optical cavity 10. More particularly, mode matching lens 6 directs the coupling laser beam 2A defined at the first power level towards the input coupler 12 of resonant optical cavity 10.

It should be understood that the coupling laser beam 2A may also be directed at the dichroic mirror 9. The dichroic mirror 9 may be configured to receive and direct the coupling laser beam 2A towards the resonant optical cavity 10, more particularly the input coupler 12 of resonant optical cavity 10. At this stage, the coupling laser beam 2A still remains at the first power level once the coupling laser beam 2A interacts with and passes through the dichroic mirror 9.

Once directed from the mode matching lens 6, the coupling laser beam 2A defining the first power level is then received by the input coupler 12 inside or internal of resonant optical cavity 10. More particularly, the coupling laser beam 2A defining the first power level is then received at the first optical surface 12A of input coupler 12 inside or internal of resonant optical cavity 10. At this stage, the coupling laser beam 2A begins to increase and/or enhances from the first power level to the second power level once the coupling laser beam 2A interacts with and passes through the input coupler 12. The input coupler 12 may then direct the coupling laser beam 2A towards the vapor cell 14 for increasing the RF sensitivity of the vapor cell 14 and towards the set of reflective mirrors 20 to further enhance the coupling laser beam 2A from the first power level to the second power level inside or internal of resonant optical cavity 10. Stated differently, the input coupler 12 may then direct the coupling laser beam 2A towards the vapor cell 14 for increasing the RF sensitivity of the vapor cell 14 and towards the set of reflective mirrors 20 to build up and/or increase the coupling laser beam 2A from the first power level to the second power level via circulation inside of or internal of the resonant optical cavity 10.

Once directed from the input coupler 12, the coupling laser beam 2A defining the second power level is then received by the vapor cell 14 of resonant optical cavity 10. More particularly, the coupling laser beam 2A defining the second power level is then received at the first wall 14A of vapor cell 14. During this stage, the atoms provided in the vapor cell 14 (e.g., Rydberg atoms) may be excited from a first energy state to a second energy state in order to provide greater sensitivity when sensing RF signals across the RF spectrum (as discussed above). Once interacted with the vapor cell 14, the coupling laser beam 2A is then direct towards the set of reflective mirrors 20, via the input coupler 12, to further enhance the coupling laser beam 2A to the second power level. More particularly, the coupling laser beam 2A is directed through the second wall 14B of vapor cell 14, via the input coupler 12, towards the first reflective mirror 22 of the set of reflective mirrors 20 to further enhance the coupling laser beam 2A to the second power level.

At this stage, the atoms provided in the vapor cell 14 are excited from an initial excited state or atomic ground state to a first excited state by the probe laser beam 4A emitted into the vapor cell 14 (see FIG. 4A). The atoms provided in the vapor cell 14 are then further excited from a first excited state to a second excited state or Rydberg excited state by the coupling laser beam 2A emitted into the vapor cell 14 (see FIG. 4A).

Once directed through the vapor cell 14, the coupling laser beam 2A continues to transition from the first power level to the second power level is then received by the first reflective mirror 22. More particularly, the coupling laser beam 2A that continues to transition from the first power level to the second power level is received at the first optical surface 22A of the first reflective mirror 22. At this stage, the coupling laser beam 2A continues to increase and/or enhance from the first power level to the second power level by interacting with and reflecting off of the first reflective mirror 22 at the first optical surface 22A. The first reflective mirror 22 may then direct the coupling laser beam 2A to the second reflective mirror 24 of the set of reflective mirrors 20 to further enhance the coupling laser beam 2A from the first power level to the second power level.

Once reflected from the first reflective mirror 22, the coupling laser beam 2A that is still continuing to transition from the first power level to the second power level is then received by the second reflective mirror 24. More particularly, the coupling laser beam 2A that continues to transition from the first power level to the second power level is received at the second optical surface 24B of the second reflective mirror 24. At this stage, the coupling laser beam 2A continues to increase and/or enhance from the first power level to the second power level by interacting with and reflecting off of the second reflective mirror 24 at the second optical surface 24B. The second reflective mirror 24 may then direct the coupling laser beam 2A to the third reflective mirror 26 of the set of reflective mirrors 20 to further enhance the coupling laser beam 2A from the first power level to the second power level.

Once reflected from the second reflective mirror 24, the coupling laser beam 2A that is still continuing to transition from the first power level to the second power level is then received by the third reflective mirror 26. More particularly, the coupling laser beam 2A that is still continuing to transition from the first power level to the second power level is received at the first optical surface 26A of the third reflective mirror 26. At this stage, the coupling laser beam 2A continues to increase and/or enhance from the first power level to the second power level by interacting with and reflecting off of the third reflective mirror 26 at the first optical surface 26A. The third reflective mirror 26 may then redirect the coupling laser beam 2A defining the second power level to the input coupler 12. As such, the coupling laser beam 2A defining the second power level continuously circulates inside of the resonant optical cavity 10 as long as the coupling laser source 2 continuously emits the coupling laser 2.

Upon the enhancement of coupling laser beam 2A from the first power level to the second power level, the coupling photodetector 8A is configured to receive and monitor the coupling laser beam 2A. As discussed above, the coupling photodetector 8A is configured to monitor a resonance condition of resonant optical cavity of system 1 and to maintain the resonance of resonant optical cavity via a conventional laser or cavity stabilization techniques. It should be appreciated that any suitable laser or cavity stabilization technique may be used for monitoring and maintaining resonance condition of resonant optical cavity of system 1. In one example, the Pound-Drever-Hall locking technique may be used in system 1 for coupling photodetector 8A for monitoring and maintaining resonance condition of resonant optical cavity of system 1.

It should be understood that coupling laser beam 2A is reflected one or more cycles or round trips inside of the resonant optical cavity 10 to further increase or enhance the power level of coupling laser beam 2A from the first power level emitted by the coupling laser source 2 external to the resonant optical cavity 10 to the second power level inside of or internal of the resonant optical cavity 10. As such, the coupling laser beam 2A may be reflected between the input coupler 12, the first reflective mirror 22, the second reflective mirror 24, and the third reflective mirror 26 to further increase or enhance the power level of coupling laser beam 2A until the coupling laser beam 2A is at the second power level. In one example, the coupling laser beam 2A may be reflected between 60 cycles or round trips inside of the resonant optical cavity 10 up to 100 cycles or round trips inside of the resonant optical cavity 10 until the coupling laser beam 2A is at the second power level. By further enhancing the coupling laser beam 2A one or more cycles inside of the resonant optical cavity 10, more atoms provided in vapor cell 14 may also be excited from a first energy state to a Rydberg energy state or second energy state in order to provide greater sensitivity when sensing RF signals across the RF spectrum.

Simultaneously, with respect to the probe laser beam 4A, the probe laser beam 4A may initially interact with the resonant optical cavity 10 upon being emitted from probe laser source 4. More particularly, the probe laser beam 4A may initially interact with the second optical surface 22B of first reflective mirror 22 upon being emitted from probe laser source 4. Based on the transmission and reflection characteristics of first reflective mirror 22, first reflective mirror 22 may then direct the probe laser beam 4A towards the vapor cell 14.

Once transmitted by first reflective mirror 22, the probe laser beam 4A is then received by the vapor cell 14 of resonant optical cavity 10. More particularly, the probe laser beam 4A is then received at the second wall 14B of vapor cell 14. During this stage, the atoms provided in the vapor cell 14 (e.g., Rydberg atoms) may be excited from a first energy state to a second energy state in order to provide greater sensitivity when sensing RF signals across the RF spectrum (as discussed above). The vapor cell 14 may then direct the probe laser beam 4A towards the input coupler 12 to measure and analyze the probe laser beam 4A via the probe photodetector 8B. More particularly, vapor cell 14 may then direct the probe laser beam 4A from the first wall 14A towards the input coupler 12 to measure and analyze the probe laser beam 4A via the probe photodetector 8B.

Once transmitted by vapor cell 14, the probe laser beam 4A may then interact with the input coupler 12. More particularly, the probe laser beam 4A may interact with the second optical surface 12B of input coupler 12. Based on the transmission and reflection characteristics of the input coupler 12, input coupler 12 then directs and/or transmits the probe laser beam 4A towards dichroic mirror 9.

Once transmitted by input coupler 12, the probe laser beam 4A may then interact with the dichroic mirror 9. More particularly, the probe laser beam 4A may interact with the second optical surface 9B of dichroic mirror 9. Based on the transmission and reflection characteristics of the input coupler 12, dichroic mirror 9 then reflects the probe laser beam 4A towards the probe photodetector 8B for measuring and analyzing the probe laser beam 4A.

Figure 3:
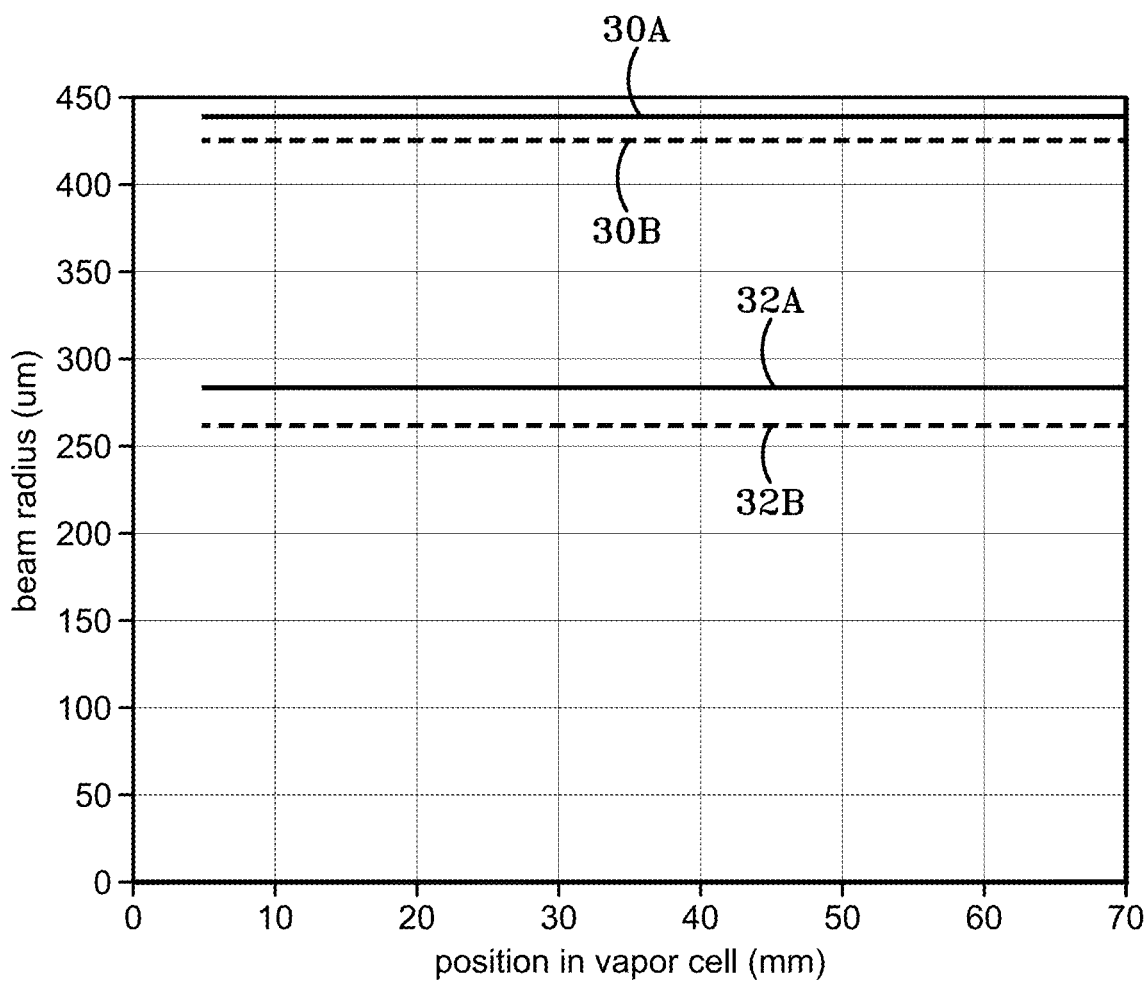
FIG. 3 (FIG. 3) is an exemplary table showing beam radii analysis of a probe laser beam and a coupling laser beam emitted in the system shown in FIG. 1.

FIG. 3 illustrates an exemplary graph showing beam radius analysis of the coupling laser beam 2A and the probe laser beam 4A inside of a vapor cell (e.g., vapor cell 14). As discussed herein, the terms "beam radius" or "beam radii" are described as the distance from the beam axis where the optical intensity drops to about 13.5 percent on the beam axis. As illustrated herein, beam radius in the resonant optical cavity 10 shows two different geometries that highlight flexibility in beam size for coupling laser beam 2A and probe laser beam 4A. As shown in FIG. 3, solid lines denote the vertical beam radius of coupling laser beam 2A (line labeled 32A) and probe laser (line labeled 30A) based on the position inside of vapor cell. Still referring to FIG. 3, dashed lines denote the horizontal beam radius of coupling laser beam 2A (line labeled 32B) and the probe laser beam 4A (line labeled 30B) based on the position inside of vapor cell.

It should be appreciated the results shown in FIG. 3 should not limit or narrow the use of system 1 with these specific beam radius of the coupling laser beam 2A and the probe laser beam 4A. As such, system 1 may allow for various beam radii inside of vapor cell 14 for coupling laser beam 2A and probe laser beam 4A based on various considerations, the configuration of the input coupler 12, vapor cell 14, and the high reflectivity mirrors 20 of resonant optical cavity 10.

Figure 5:
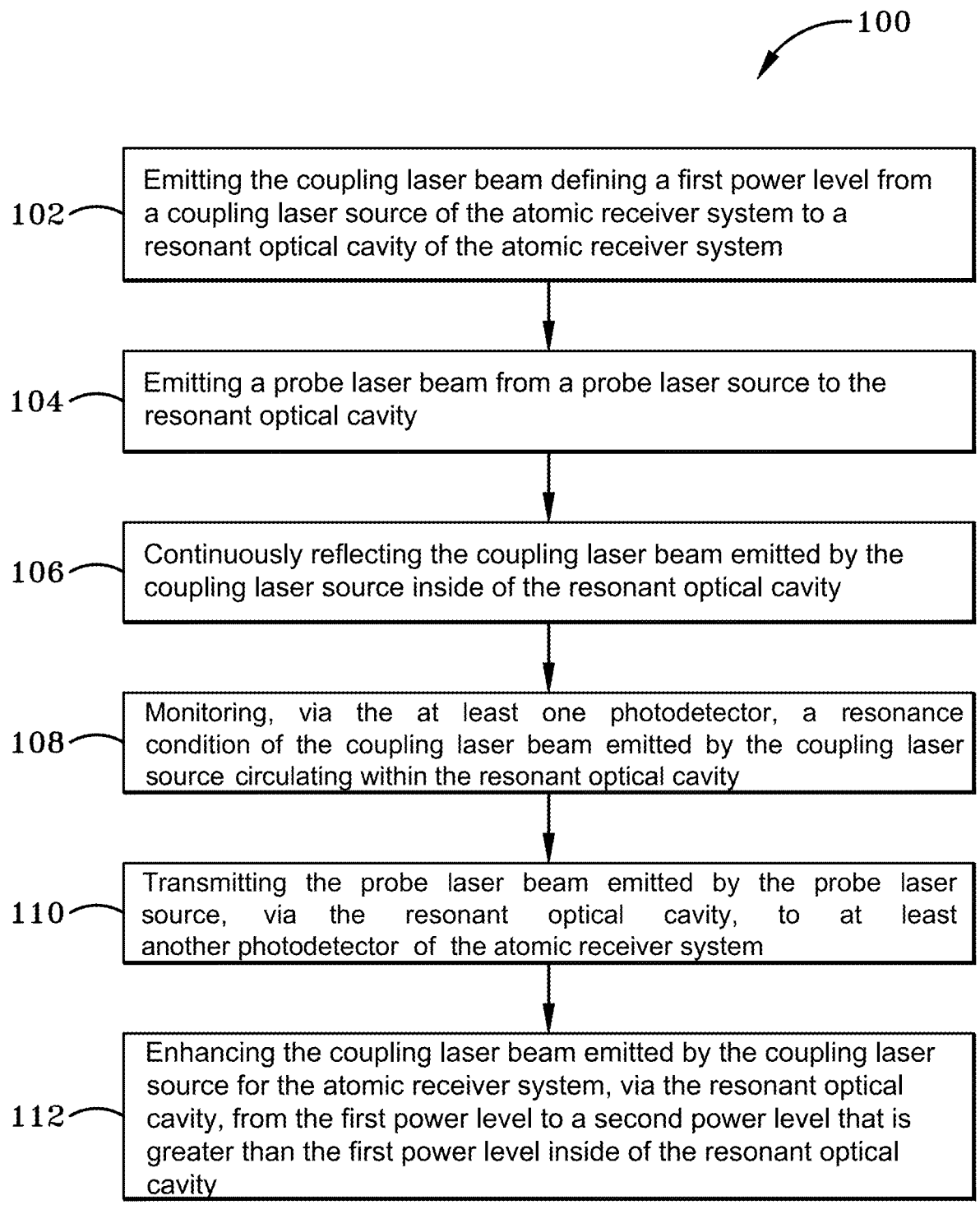
FIG. 5 (FIG. 5) is a method flowchart for enhancing the power of a coupling laser beam for an atomic receiver system.

FIG. 5 illustrates a method 100 of enhancing a coupling laser for an atomic receiver system for at least one cycle. An initial step 102 of method 100 includes emitting the coupling laser beam defining a first power level from a coupling laser source of the atomic receiver system to a resonant optical cavity of the atomic receiver system. Another step 104 of method 100 includes emitting a probe laser beam from a probe laser source to the resonant optical cavity. Another step 106 of method 100 includes continuously reflecting the coupling laser beam emitted by the coupling laser source inside of the resonant optical cavity. Another step 108 of method 100 includes monitoring, via the at least one photodetector, a resonance condition of the coupling laser beam emitted by the coupling laser source circulating within the resonant optical cavity. Another step 110 of method 100 includes transmitting the probe laser beam emitted by the probe laser source, via the resonant optical cavity, to at least another photodetector of the atomic receiver system. Another step 112 of method 100 includes enhancing the coupling laser beam emitted by the coupling laser source for the atomic receiver system, via the resonant optical cavity, from the first power level to a second power level that is greater than the first power level inside of the resonant optical cavity.

Optional and/or additional steps may be further included with method 100 for enhancing a coupling laser for an atomic receiver system. Optional steps may further include transmitting the coupling laser defining the first power level from a mode matching lens of the atomic receiver system to an input coupler of the resonant optical cavity; transmitting the coupling laser from the input coupler to a vapor cell of the resonant optical cavity; transmitting the coupling laser from the vapor cell to a first reflective mirror of the resonant optical cavity; transmitting the coupling laser from the first reflective mirror to a second reflective mirror of the resonant optical cavity; transmitting the coupling laser from the second reflective mirror to a third reflective mirror of the resonant optical cavity; and transmitting the coupling laser from the third reflective mirror to the input coupler; wherein the coupling laser defines the second power level; wherein the vapor cell is an anti-reflection (AR) coated vapor cell or a Brewster cut vapor cell positioned inside of the resonant optical cavity. Optional steps may further include transmitting the probe laser from the probe laser source to a first reflective mirror of the resonant optical cavity; transmitting the probe laser from the first reflective mirror to a vapor cell of the resonant optical cavity; transmitting the probe laser from the vapor cell to an input coupler of the resonant optical cavity; transmitting the probe laser from the input coupler to a dichroic mirror of the resonant optical cavity; and transmitting the probe laser from the dichroic mirror to the at least another photodetector.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein in the specification and in the claims, the term "effecting" or a phrase or claim element beginning with the term "effecting" should be understood to mean to cause something to happen or to bring something about. For example, effecting an event to occur may be caused by actions of a first party even though a second party actually performed the event or had the event occur to the second party. Stated otherwise, effecting refers to one party giving another party the tools, objects, or resources to cause an event to occur. Thus, in this example a claim element of "effecting an event to occur" would mean that a first party is giving a second party the tools or resources needed for the second party to perform the event, however the affirmative single action is the responsibility of the first party to provide the tools or resources to cause said event to occur.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "above", "behind", "in front of", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal", "lateral", "transverse", "longitudinal", and the like are used herein for the purpose of explanation only unless specifically indicated otherwise.

Although the terms "first" and "second" may be used herein to describe various features/elements, these features/elements should not be limited by these terms, unless the context indicates otherwise. These terms may be used to distinguish one feature/element from another feature/element. Thus, a first feature/element discussed herein could be termed a second feature/element, and similarly, a second feature/element discussed herein could be termed a first feature/element without departing from the teachings of the invention.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the present disclosure. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

To the extent that the present disclosure has utilized the term "invention" in various titles or sections of this specification, this term was included as required by the formatting requirements of word document submissions pursuant the guidelines/requirements of the United States Patent and Trademark Office and shall not, in any manner, be considered a disavowal of any subject matter.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A system, comprising:
   a coupling laser source to emit a coupling laser beam defining a first power level;
   a probe laser source to emit a probe laser beam;
   a resonant optical cavity optically aligned with the coupling laser source and the probe laser source, wherein the resonant optical cavity receives the coupling laser beam emitted by the coupling laser source and the probe laser beam emitted by the probe laser source; wherein the resonant optical cavity is configured to enhance the coupling laser beam emitted by the coupling laser source to a second power level that is greater than the first power level internal to the resonant optical cavity;
   at least one photodetector positioned external to and optically aligned with the resonant optical cavity configured to monitor a resonance condition of the coupling laser beam circulating within the resonant optical cavity; and
   at least another photodetector positioned external to the resonant optical cavity and configured to receive the probe laser beam.

2. The system of claim 1, wherein the resonant optical cavity comprises:
   a vapor cell optically positioned between the coupling laser source and the probe laser source;
   wherein the vapor cell is configured to receive and transmit the coupling laser beam defining the first power level emitted by the coupling laser source; and
   wherein the vapor cell is configured to receive and transmit the probe laser beam emitted by the probe laser source.

3. The system of claim 2, wherein the vapor cell is an anti-reflection (AR) coated vapor cell or a Brewster cut vapor cell positioned inside of the resonant optical cavity.

4. The system of claim 2, wherein the resonant optical cavity further comprises:
   at least two reflective mirrors optically aligned with the vapor cell, the coupling laser source, and the probe laser source; and
   an input coupler optically aligned with the at least two reflective mirrors and the vapor cell;
   wherein the at least two reflective mirrors and the input coupler are configured to enhance the coupling laser beam emitted by the coupling laser source from the first power level to the second power level.

5. The system of claim 2, wherein the resonant optical cavity further comprises:
   an input coupler optically aligned with the vapor cell; and
   a first reflective mirror optically aligned with the vapor cell;
   wherein the input coupler is configured to receive the coupling laser beam emitted by the coupling laser source and reflect the coupling laser beam towards the vapor cell and the first reflective mirror; and
   wherein the first reflective mirror is configured to receive the coupling laser beam reflected from the input coupler and through the vapor cell to reflect the coupling laser beam inside of the resonant optical cavity.

6. The system of claim 5, wherein the first reflective mirror comprises:
   a first optical surface facing the vapor cell; and
   a second optical surface facing away from the vapor cell and opposite to the first optical surface;
   wherein each of the first optical surface and the second optical surface are substantially planar.

7. The system of claim 5, wherein the resonant optical cavity further comprises:
   a second reflective mirror optically aligned with the first reflective mirror;
   wherein the second reflective mirror is configured to receive the coupling laser beam emitted by the coupling laser source from the first reflective mirror and to reflect the coupling laser beam inside of the resonant optical cavity.

8. The system of claim 7, wherein the second reflective mirror comprises:
   a first optical surface facing away from the first reflective mirror; and
   a second optical surface facing towards the first reflective mirror and opposite to the first optical surface;
   wherein the first optical surface is substantially planar and the second optical surface is concavely-shaped.

9. The system of claim 7, wherein the resonant optical cavity further comprises:
   a third reflective mirror optically aligned with the second reflective mirror;
   wherein the third reflective mirror is configured to receive the coupling laser beam reflected from the second reflective mirror and to reflect the coupling laser beam to the input coupler.

10. The system of claim 9, wherein the third reflective mirror comprises:
   a first optical surface facing the second reflective mirror; and
   a second optical surface facing away from the second reflective mirror and opposite to the first optical surface;
   wherein the first optical surface is concavely-shaped and the second optical surface is substantially planar.

11. The system of claim 9, wherein the resonant optical cavity further comprises:
   a first electric field reflection coefficient defined by the first reflective mirror;
   a second electric field reflection coefficient defined by the second reflective mirror;
   a third electric field reflection coefficient defined by the third reflective mirror; and
   a fourth electric field reflection coefficient defined by the input coupler;
   wherein the fourth electric field reflection coefficient is less than the first electric field reflection coefficient, second electric field reflection coefficient, and the third electric field reflection coefficient.

12. The system of claim 1, further comprising:
   a mode matching lens optically aligned with the coupling laser source and the resonant optical cavity;
   wherein the mode matching lens is configured to receive and transmit the coupling laser beam emitted by the coupling laser source defining the first power level to the resonant optical cavity.

13. The system of claim 1, further comprising:
   a dichroic mirror optically aligned with the probe laser source and the resonant optical cavity;
   wherein the dichroic mirror is configured to receive the probe laser beam emitted by the probe laser source from the resonant optical cavity and to reflect the probe laser beam to the at least another photodetector.

14. The system of claim 1, wherein the resonant optical cavity is a bowtie-type resonant optical cavity.

15. The system of claim 1, further comprising:
   a first beam radius defined by the coupling laser beam emitted by the coupling laser source external of the resonant optical cavity; and
   a second beam radius defined by the coupling laser beam emitted by the coupling laser source internal of the resonant optical cavity;
   wherein the second beam radius is greater than the first beam radius for increasing a sensitivity of the resonant optical cavity.

16. A resonant optical cavity, comprising:
   a vapor cell optically aligned between a coupling laser source and a probe laser source;
   at least two reflective mirrors optically aligned with the vapor cell, the coupling laser source, and the probe laser source; and
   an input coupler optically aligned with the vapor cell and the at least two reflective mirrors;
   wherein the vapor cell, the at least two reflective mirrors, and the input coupler are configured to enhance a coupling laser beam emitted by the coupling laser source from a first power level to a second power level internal of the resonant optical cavity wherein the second power level is greater than the first power level inside of the resonant optical cavity.

17. The resonant optical cavity of claim 16, wherein the at least two reflective mirrors comprise:
   a first reflective mirror optically aligned with the vapor cell; and
   a second reflective mirror optically aligned with the first reflective mirror and the input coupler;
   wherein an optical surface of each of the first reflective mirror and the second reflective mirror is concavely-shaped and face one another.

18. The resonant optical cavity of claim 16, wherein the vapor cell is an anti-reflection (AR) coated vapor cell or a Brewster cut vapor cell positioned inside of the resonant optical cavity.

19. A method of enhancing a coupling laser beam for an atomic receiver system, the method comprising:
   emitting the coupling laser beam defining a first power level from a coupling laser source of the atomic receiver system to a resonant optical cavity of the atomic receiver system;
   emitting a probe laser beam from a probe laser source to the resonant optical cavity;
   continuously reflecting the coupling laser beam emitted by the coupling laser source inside of the resonant optical cavity;
   monitoring, via the at least one photodetector, a resonance condition of the coupling laser beam emitted by the coupling laser source circulating within the resonant optical cavity;
   transmitting the probe laser beam emitted by the probe laser source, via the resonant optical cavity, to at least another photodetector of the atomic receiver system; and
   enhancing the coupling laser beam emitted by the coupling laser source for the atomic receiver system, via the resonant optical cavity, from the first power level to a second power level that is greater than the first power level inside of the resonant optical cavity.

20. The method of claim 19, further comprising:
   transmitting the coupling laser defining the first power level from a mode matching lens of the atomic receiver system to an input coupler of the resonant optical cavity;
   transmitting the coupling laser from the input coupler to a vapor cell of the resonant optical cavity;
   transmitting the coupling laser from the vapor cell to a first reflective mirror of the resonant optical cavity;

transmitting the coupling laser from the first reflective mirror to a second reflective mirror of the resonant optical cavity;
transmitting the coupling laser from the second reflective mirror to a third reflective mirror of the resonant optical cavity; and
transmitting the coupling laser from the third reflective mirror to the input coupler;
wherein the coupling laser defines the second power level;
wherein the vapor cell is an anti-reflection (AR) coated vapor cell or a Brewster cut vapor cell positioned inside of the resonant optical cavity.

21. The method of claim 19, further comprising:
transmitting the probe laser from the probe laser source to a first reflective mirror of the resonant optical cavity;
transmitting the probe laser from the first reflective mirror to a vapor cell of the resonant optical cavity;
transmitting the probe laser from the vapor cell to an input coupler of the resonant optical cavity;
transmitting the probe laser from the input coupler to a dichroic mirror of the resonant optical cavity; and
transmitting the probe laser from the dichroic mirror to the at least another photodetector.

* * * * *